(12) United States Patent
Brabec et al.

(10) Patent No.: US 7,413,997 B2
(45) Date of Patent: Aug. 19, 2008

(54) NANOSTRUCTURED ELECTRODE

(75) Inventors: Christoph Brabec, Linz (AT); Pavel Schilinsky, Nüremberg (DE); Christoph Waldauf, Innsbruck (AT)

(73) Assignee: Konarka Technologies, Inc., Lowell, MA (US)

( * ) Notice: Subject to any disclaimer, the term of this patent is extended or adjusted under 35 U.S.C. 154(b) by 197 days.

(21) Appl. No.: 11/184,463

(22) Filed: Jul. 19, 2005

(65) Prior Publication Data

US 2006/0024936 A1 Feb. 2, 2006

(30) Foreign Application Priority Data

Jul. 29, 2004 (DE) .................. 10 2004 036 792

(51) Int. Cl.
*H01L 21/31* (2006.01)
(52) U.S. Cl. ..................................... 438/758
(58) Field of Classification Search ................. 438/758
See application file for complete search history.

(56) References Cited

U.S. PATENT DOCUMENTS

| 2001/0038900 | A1* | 11/2001 | Todori et al. | 428/64.4 |
| 2005/0098205 | A1* | 5/2005 | Roscheisen et al. | 136/263 |
| 2005/0246002 | A1* | 11/2005 | Martinez | 607/116 |
| 2007/0170071 | A1* | 7/2007 | Suh et al. | 205/687 |

FOREIGN PATENT DOCUMENTS

| DE | 102 311 40 A1 | 1/2004 |
| EP | 0 993 235 A2 | 4/2000 |
| GB | 2 374 202 | 10/2002 |
| WO | WO 01/59854 | 8/2001 |
| WO | WO 03/034130 | 4/2003 |

OTHER PUBLICATIONS

Brabec et al., *Organic Photovoltaics: Concepts and Realizations*, 1st ed., pp. 169-177, (2003).
Kim et al., "Flexible conjugated polymer photovoltaic cells with controlled heterojunctions fabricated using nanoimprint lithography," Appl. Phys. Lett. 90, 123113 (2007).
Paasch, et al., "Designing Organic Field Effect Transistors," Internationales Wissenschaftliches Kolloquium, Technische Universitat Ilmenau, pp. 237-238, (2003).
Stutzmann et al., "Self-aligned, vertical-channel, polymer field-effect transistors," Science, 299(5614):1881-4 (2003).
M.K. Nazeeruddin et al., "Conversion of Light into Electricity with Trinuclear Ruthenium Complexes Adsorbed on Textured $TiO_2$ Films," Helvetica Chimica Acta, vol. 73, 1990, pp. 1778-1803.

(Continued)

*Primary Examiner*—Lex Malsawma
(74) *Attorney, Agent, or Firm*—Fish & Richardson P.C.

(57) ABSTRACT

In some embodiments, the inventive concept provides for a process for depositing a substance on a nanostructured surface, particularly for organic components, to yield a substantially consistent and homogeneous coating on the nanostructured surface. The substance to be applied is dissolved in a solvent. The coating for the nanostructured surface is then produced by depositing the first dissolved substance on the nanostructured surface.

27 Claims, 1 Drawing Sheet

OTHER PUBLICATIONS

Figure 1A:
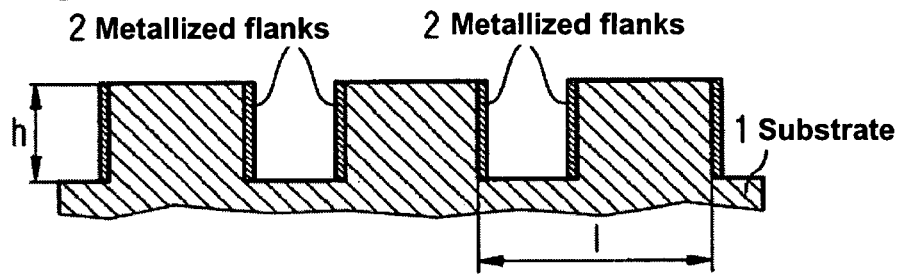

M. Austin et al., "Fabrication of 70nm channel length polymer organic thin-film transistors using nanoimprint lithography," Applied Physics Letters, vol. 81, No. 23, Dec. 2, 2002, pp. 4431-4433.

H. Sirringhaus et al., "High-Resolution Ink-Jet Printing of All Polymer Transisitor Circuits," MRS Bulletin, vol. 26, No. 7, Jul. 2001, pp. 539-543.

* cited by examiner

Printing from solution

Multi-layer deposition

NANOSTRUCTURED ELECTRODE

CROSS-REFERENCE TO RELATED APPLICATION

This application claims priority under 35 U.S.C. §119 to German application No. 102004036792.2, filed Jul.29. 2004 and is incorporated by reference herein.

The present invention concerns semiconductor components. In particular, the present invention concerns nanostructured substrates suitable, inter alia, for organic semiconductor components.

Organic integrated circuits, i.e. circuits based on organic materials or polymeric electrical materials, are suitable for the economical production of electrical and electronic circuits for mass applications and disposable products, such as, for example, contactlessly readable identification and product transponders (radio frequency identification [RFID] transponders), but are equally suitable for high-cost products such as, for example, organic displays, organic photovoltaic systems (organic solar cells), etc.

The development of organic integrated circuits has been marked by many fundamental successes, but continues to be in a constant state of evolution. Many commercial products —especially consumer products—equipped with organic integrated circuits can be expected to reach market-readiness in the foreseeable future.

Organic integrated circuits, for example organic field effect transistors (OFETs), organic light-emitting diodes (OLEDs), organic photovoltaic elements (OPVs) (organic solar cells), are typically constructed of various functional layers. As highly promising substrates, nanostructured substrates and nanostructured electrodes on suitable substrates, which have functional advantages over ordinary electrodes and substrates, are currently being investigated.

In conventional practice, semiconductor layers, particularly organic semiconductor layers, are deposited on nanostructured electrodes by spin-coating. The nanostructuring itself makes it very difficult, if not impossible, to form a homogeneous and consistent semiconductor layer using ordinary coating processes.

One object of the invention is, therefore, to provide a coating process by which a homogeneous and consistent coating can be applied to nanostructured electrodes. This coating process is further intended to achieve the object of being able to be performed in an inexpensive and reproducible manner.

According to the invention, the above-defined objects are achieved by means of the subject matter of the appended claims, particularly claim 1. The inventive concept provides for suitable dissolution of the substance that is to be applied to the nanostructured surface.

Provided according to the invention is a process for coating a nanostructured surface, particularly for organic components. A first substance to be applied is dissolved in a solvent. A first coating of the nanostructured surface is then produced by depositing the first dissolved substance on the nanostructured surface.

The first dissolved substance is advantageously deposited on the nanostructured surface in such a way that the nanostructured surface is covered by a consistently thin, homogeneous wet film composed substantially of the dissolved substance.

The nanostructured surface is preferably a nanostructured electrode, i.e., a nanostructured surface provided with an electrode layer. The electrode layer is further preferably structured.

Further according to the invention, a viscosity of the dissolved first substance is adjusted in such a way that the first dissolved substance can be made to flow into pot structures of the nanostructured surface. In keeping with its structuring, the nanostructured surface has projections respectively defining recesses that will be referred to hereinafter as the above-described pot structures.

The solvent can simultaneously be a printing medium, and the first dissolved substance can accordingly be deposited or applied by means of a printing process. The printing process is preferably a substantially contactless printing process in order to protect the nanostructured structure against, for example, damage.

The first substance is preferably an organic semiconductor substance and the deposited first coating a semiconductor layer.

According to the invention, surface properties of the nanostructured surface can differ at least regionally. In particular, the nanostructured surface can have regionally varying wetting properties with respect to the first dissolved substance.

In addition, the inventive process further comprises the deposition of a second substance on the first coating, said second substance being dissolved in an additional solvent and the second coating being created on the first coating by depositing the second dissolved substance on the first coating. The additional solvent can be the same solvent as that used for the first substance, but alternatively can also be a solvent suitable for the second substance that is different from that used for the first substance.

The additional solvent is advantageously selected so as to permit at least partial mixing of the first coating and the second coating during the deposition of the second dissolved substance.

The second substance is further advantageously an organic semiconductor substance, an electrically conductive substance or a nonparticulate substance. The second coating can in particular be a semiconductor layer or an electrode layer.

Figure 1B:
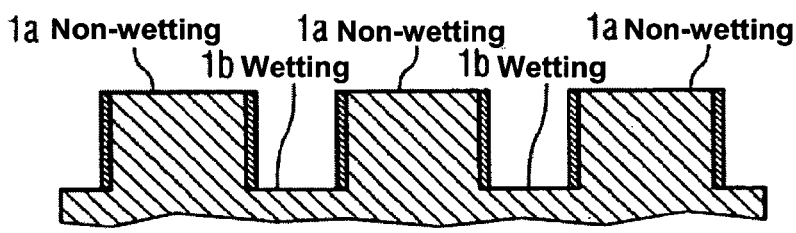
Figure 2:
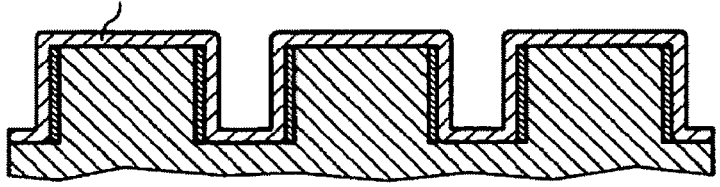
Figure 3:
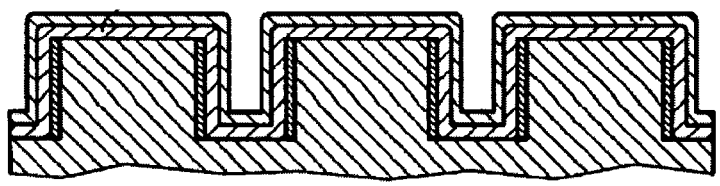

Details and preferred embodiments of the inventive subject matter will emerge from the dependent claims and the drawings, on the basis of which exemplary embodiments will be described in detail below in order to clarify the inventive subject matter. In the drawings:

FIG. 1a shows a nanostructured electrode according to one embodiment of the invention, disposed on a substrate;

FIG. 1b shows an advantageous physical configuration for the nanostructured electrode of FIG. 1a, according to a further embodiment of the invention; FIG. 2 shows, in continuation of FIGS. 1a and 1b, the nanostructured electrode according to the embodiments of the invention, provided with a semiconductor layer; and FIG. 3 shows, in continuation of FIG. 2, the nanostructured electrode according to the embodiments of the invention, provided with an additional layer.

FIGS. 1a to 3 show, by way of example, the steps involved in the application of layers during the production process of an organic semiconductor component comprising a nanostructured electrode, such as, for example, an organic field effect transistor (OFET) or an organic solar cell, which serve as exemplary embodiments of the present invention.

Referring to FIG. 1a, a substrate 1 comprising a nanostructured electrode is depicted. Serving as the nanostructured electrode are [sic] the substrate 1 formed to comprise nanostructures whose flanks are metallized, i.e., provided with a metallic, electrically conductive layer. Such nanostructures typically have a height h in the range of 50 nm (nanometers) to 5000 nm and a period length 1 in the range of 50 nm to 5000 nm. Neither this height nor this period range is to be construed as limiting, however. The nanostructured electrode is composed of the multiplicity of metallized flanks of the nanostructures of substrate 1.

As described above, the difficulty in using such nanostructured electrodes resides in forming a layer, particularly an organic semiconductor layer, that makes allowance for such nanostructured electrodes and covers the described nanostructures of the electrode or the substrate 1 in a homogeneous and consistent manner. The terms homogeneity and consistency relate in particular to the formation, over the entire surface area of the nanostructured electrodes, of a layer that makes allowance for the nanostructured electrodes and has a substantially constant thickness.

It is proposed according to the invention for the constituent substance of the layer that is to be applied to the nanostructured electrode to be placed in solution so as to yield a solution of suitably low viscosity that is able to flow into the pot structures produced by the nanostructures of the electrode or substrate. In this connection, consideration can be given, inter alia, to capillary effects and to effects that are mediated by surface tension and by additional surface effects.

Advantageously, an organic semiconductor material, for example, is dissolved in a printing medium to yield a semiconductor solution. This semiconductor solution is applied to the nanostructured electrode to produce a substantially consistently thin, homogeneous wet film over the nanostructures of the electrode. A semiconductor layer 3, particularly an organic semiconductor layer, produced from this substantially consistently thin, homogeneous wet film is illustrated in FIG. 2.

Referring to FIG. 1*b*, the nanostructured electrode can further be implemented with physically advantageous properties that assist the formation of the previously described substantially consistently thin, homogeneous wet film over the nanostructures of the electrode. The nanostructured electrode is preferably implemented in such a way that it comprise [sic] regions 1*b* that have wetting properties with respect to the semiconductor solution and regions 1*a* that have non-wetting properties with respect to the semiconductor solution. The wetting properties can be adjusted, for example, via the choice of the printing medium used as the solvent.

By suitable selection of the varying wetting properties, it can be ensured that the semiconductor solution will fill the nanostructures well and substantially homogeneously and consistently. In the illustration of FIG. 1*b*, the inner surfaces and particularly the bottom surfaces of the pot regions preferably have wetting properties, while regions at the "summits" of the vertical nanostructured electrode structure have non-wetting properties.

As described above, the semiconductor solution can be applied by means of printing processes such as, for example, blading, flexo printing, etc. Alternatively, however, deposition methods such as solution extrusion can also be used. In regard to the printing processes, care should be taken that no "hard" parts of the printing mechanism come into mechanical contact with the substrate or the nanostructured electrode, since otherwise the nanostructures can be adversely affected or even damaged. Offset printing processes can be problematic in this connection.

Applying a substantially consistently thin, homogeneous wet film, i.e. of the semiconductor solution, ensures that after drying a substantially homogeneous and consistent semiconductor layer will form on the nanostructured electrode, as illustrated in FIG. 2.

If the demands in terms of lateral resolution are not high, alternative coating processes can also be used. Here again, with these processes it is also necessary to avoid potential adverse effects on the nanostructures in the form of damage due to mechanical contact by the coating apparatus used.

In further developments of the above-described process, multiple coating deposition can be performed. These coating processes make it possible to apply multiple semiconductor layers. For example, two semiconductor layer components can be applied one after the other in two separate coating steps.

Such application of two semiconductor layer components in two separate coating steps can be advantageous particularly in the fabrication of bulk heterojunction solar cells, since it can be assured in this way that the [sic] one of the semiconductor layer components components [sic] makes contact with the desired electrode. In this case, both of the semiconductor layers are preferably deposited from the above-described semiconductor solutions, which further preferably permit mixing of the two layers. One of the above-cited printing processes or an alternative coating process is preferably used to deposit the semiconductor layers.

Multiple-coating deposition also makes it possible to deposit a layer package composed of a semiconductor layer and an electrode layer. In particular, it is possible to apply a coated electrode layer. In this case, the semiconductor layer is first applied to the nanostructured electrode from a semiconductor solution by means of the above-described process. An electrode layer, for example a top electrode layer, is then applied to the resulting structure, i.e., the semiconductor layer covering the nanostructured electrode, by means of a printing or coating process. The electrode layer can be composed of organic semiconductors and conductors or of nanoparticulate solutions, particularly indium/tin oxide (ITO) particles and zinc oxide (ZnO) nanoparticles. Such electrode layers are needed in the production of organic light-emitting diodes (OLEDs) and organic photovoltaic components (OPV) such as organic solar cells, and for organic field effect transistors (OFETs) in the form of the gate electrode layer.

By the proposed dissolving of the semiconductor substance in a printing medium and the subsequent application of the resulting semiconductor solution, the inventive concept makes it possible to produce organic and hybrid (i.e. mixed forms composed of organic and inorganic functional components of the semiconductor component) semiconductor components comprising nanostructured electrodes by means of a printing process the formation of a resulting semiconductor layer on the nanostructured electrodes having the above-described advantages over known, conventional processes [sentence sic]. The inventive process is substantially independent of the formation of the nanostructured electrodes, i.e., independent of their specific parameters such as height h, period length l, surface properties, etc. Nanostructured electrodes are of particular interest in the production of organic light-emitting diodes (OLEDs), organic photovoltaic components (OPVs), organic field effect transistors (OFETs), etc. However, the invention is also intended to encompass further areas of application of such nanostructured electrodes.

Varying or modifying the physical surface properties of nanostructured electrodes in terms of wetting properties by means of the semiconductor solution and multi-layer deposition constitute complementary advantageous modifications or development [sic] of the inventive concept.

The following embodiments can be implemented by means of the inventive process described hereinabove.

A first embodiment of the invention provides for an organic solar cell (OPV) comprising nanostructured electrodes, of which at least the semiconductor layer to be applied to the nanostructured electrode can be produced by means of the above-described process. In one embodiment of the invention, the top electrode layer of the organic solar cell can be created by the multi-layer deposition technique also described above.

A second embodiment of the invention provides for an organic light-emitting diode (OLED) comprising nanostructured electrodes, of which at least the semiconductor layer to be applied to the nanostructured electrode can be produced by means of the above-described process. In one embodiment of the invention, the top electrode layer of the organic light-emitting diode can be created by the multi-layer deposition technique also described above.

A third embodiment of the invention provides for an organic field effect transistor (OFET) comprising nanostructured electrodes, of which at least the semiconductor layer to be applied to the nanostructured electrode can be produced by means of the above-described process. In one embodiment of the invention, the gate electrode layer of the organic field effect transistor can be created by the multi-layer deposition technique also described above.

The invention claimed is:

1. A process, comprising:
   providing a substrate having projections that define recessed regions, wherein:
      each of at least some of the projections has an upper surface and metallized flanks;
      each recessed region has a surface;
      the surface of each of at least some of the recessed regions is more wettable than the upper surface of each of at least some of the projections; and
      the surfaces of the recessed regions, the upper surfaces of the projections, and surfaces of the metallized flanks form a nanostructure surface that comprises a plurality of electrodes; and
   forming a first coating on the nanostructured surface by applying a first solution to the nanostructured surface to form a portion of an organic component;
   wherein:
      the first solution comprises a first dissolved substance and a first solvent; and
      the organic component is a component of a field effect transistor, a light emitting diode, or a photovoltaic cell.

2. The process according to claim 1, wherein the first dissolved substance is applied in such a way that the nanostructured surface is covered by a consistently thin, homogeneous wet film of said first dissolved substance.

3. The process according to claim 1, wherein a viscosity of the first solution is adjusted in such a way that the first dissolved substance is able to flow into the recessed regions of the nanostructured surface.

4. The process according to claim 1, wherein the first solvent is a printing medium and the first dissolved substance is applied using a printing process.

5. The process according to claim 4, wherein the printing process is a substantially contactless printing process.

6. The process according to claim 1, wherein the first substance is an organic semiconductor substance.

7. The process according to claim 1, wherein the first coating is a semiconductor layer.

8. The process according to claim 1, wherein surface properties of the nanostructured surface differ at least regionally.

9. The process according to claim 8, wherein the nanostructured surface has regionally varying wetting properties.

10. The process according to claim 1, further comprising: applying a second coating on the first coating by applying a second solution to the first coating, wherein the second solution comprises a second dissolved substance and a second solvent.

11. The process according to claim 10, wherein the second solvent is selected so as to permit at least partial mixing of the first coating and the second coating.

12. The process according to claim 10, wherein the second substance is an organic semiconductor substance, an electrically conductive substance or a nanoparticulate substance.

13. The process according to claim 10, wherein the second coating is applied using a printing process.

14. The process according to claim 10, wherein the second coating is a semiconductor layer or an electrode layer.

15. The process of claim 10, wherein the second solvent is the same as the first solvent.

16. The process of claim 10, wherein the second coating is an electrode layer.

17. The process of claim 1, wherein the organic component comprises an organic semiconductor component.

18. The process of claim 1, wherein the organic component is a component in a photovoltaic cell.

19. The process of claim 1, wherein the organic component is a component in a field effect transistor.

20. The process of claim 1, wherein the organic component is a component of an organic photovoltaic cell.

21. The process of claim 1, wherein the organic component is a component in a light emitting diode.

22. The process of claim 1, wherein the organic component is a component of an organic photovoltaic cell.

23. A process, comprising:
   providing a substrate having projections that define recessed regions, wherein:
      each of at least some of the projections has an upper surface and metallized flanks;
      each recessed region has a surface;
      the surface of each of at least some of the recessed regions is more wettable than the upper surface of each of at least some of the projections; and
      the surfaces of the recessed regions, the upper surfaces of the projections, and surfaces of the metallized flanks form a nanostructure surface that comprises a plurality of electrodes; and
   applying a first dissolved substance to the nanostructured surface to form a portion of an organic component.

24. The process of claim 23, wherein the organic component comprises an organic semiconductor component.

25. The process of claim 23, wherein the organic component is a component in a photovoltaic cell.

26. The process of claim 23, wherein the organic component is a component in a light emitting diode.

27. The process of claim 23, wherein the organic component is a component in a field effect transistor.

* * * * *

UNITED STATES PATENT AND TRADEMARK OFFICE
CERTIFICATE OF CORRECTION

PATENT NO. : 7,413,997 B2  
APPLICATION NO. : 11/184463  
DATED : August 19, 2008  
INVENTOR(S) : Christoph Brabec Page 1 of 1

It is certified that error appears in the above-identified patent and that said Letters Patent is hereby corrected as shown below:

On the Title Page, Item -54-  
Line 1, delete "ELECTRODE" insert -- ELECTRODES --.

On the Title Page, Item -56-  
Other Publications, Line 13, delete "1778"- insert -- 1788 --.

Column 1  
Line 1, delete "ELECTRODE" insert -- ELECTRODES --.

Signed and Sealed this

Eleventh Day of November, 2008

JON W. DUDAS  
*Director of the United States Patent and Trademark Office*